(12) United States Patent
Horch

(10) Patent No.: US 8,598,642 B2
(45) Date of Patent: Dec. 3, 2013

(54) VERY DENSE NVM BITCELL

(75) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 102 days.

(21) Appl. No.: 13/027,048

(22) Filed: Feb. 14, 2011

(65) Prior Publication Data

US 2012/0205734 A1 Aug. 16, 2012

(51) Int. Cl.
*H01L 21/02* (2006.01)

(52) U.S. Cl.
USPC ........... 257/298; 257/315; 257/317; 257/296; 257/297; 257/E21.209

(58) Field of Classification Search
USPC .................................................. 257/336, 335
See application file for complete search history.

(56) References Cited

U.S. PATENT DOCUMENTS

| | | | | |
|---|---|---|---|---|
| 5,650,340 | A | * | 7/1997 | Burr et al. ................. 438/286 |
| 5,912,488 | A | * | 6/1999 | Kim et al. ................. 257/316 |
| 6,147,379 | A | * | 11/2000 | Hori et al. ................. 257/317 |
| 7,474,568 | B2 | | 1/2009 | Horch |
| 7,508,719 | B2 | | 3/2009 | Horch |
| 7,652,921 | B2 | | 1/2010 | Horch et al. |
| 7,718,492 | B2 | | 5/2010 | Horch |
| 7,800,156 | B2 | | 9/2010 | Roizin et al. |
| 7,859,043 | B2 | | 12/2010 | Pikhay et al. |
| 7,939,861 | B2 | | 5/2011 | Horch |
| 7,948,020 | B2 | | 5/2011 | Roizin et al. |
| 7,983,093 | B2 | | 7/2011 | Horch |
| 8,194,468 | B2 | | 6/2012 | Horch |
| 8,373,167 | B2 | | 2/2013 | Horch |
| 2005/0124119 | A1 | * | 6/2005 | Shim et al. ................. 438/275 |
| 2009/0212342 | A1 | | 8/2009 | Roizin et al. |
| 2010/0027346 | A1 | | 2/2010 | Roizin et al. |
| 2010/0172184 | A1 | | 7/2010 | Roizin et al. |

OTHER PUBLICATIONS

Wikipedia, MOSFET, http://en.wikipedia.org/wiki/mosfet.*
Atrash, A. et al., "Zero-Cost MTP High Density NVM Modules in a CMOS Process Flow," IEEE, 2010, pp. 1-4.
Roizin, , Y. et al., "Low-Cost Embedded NVM for Power Management Designs," ECN: Electronic Component News, Oct. 2008, 6 pages, vol. 52 Issue 11, May be retrieved at<URL:http://www-qa.jazzsemi.com/news/publications/Low-Cost%20Embedded%20NVM%20for%20Power%20Mgmt%20Designs.pdf>.

* cited by examiner

*Primary Examiner* — Eva Yan Montalvo

(74) *Attorney, Agent, or Firm* — Fenwick & West LLP

(57) ABSTRACT

An asymmetric non-volatile memory bitcell is described. The bitcell comprises source and drain regions comprising carriers of the same conductivity type. A floating gate rests on top of the well, and extends over a channel region, and at least a portion of the source and drain regions. The drain region comprises additional carriers of a second conductivity type, allowing band to band tunneling. The source region comprises additional carriers of a first conductivity type, thereby increasing source-gate capacitance. Thus, the bitcell incorporates a select device, thereby decreasing the overall size of the bitcell. The bitcell may be created without any additional CMOS process steps, or through the addition of a single extra mask step.

18 Claims, 8 Drawing Sheets

VERY DENSE NVM BITCELL

BACKGROUND

1. Field of Art

This disclosure generally relates to the field of nonvolatile memory, particularly non volatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the floating gate is electrically isolated from the surroundings by an oxide or dielectric.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and eFLASH, both of which have disadvantages. Currently, eFLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

Embodiments relate to a nonvolatile memory ("NVM") bitcell with reduced size and enhanced capacitive coupling between the source and the floating gate. The bitcell may use band to band tunneling, channel hot injection impact ionized hot electron injection, and/or enhanced source-floating gate capacitive coupling to read, write, or erase the bitcell.

In one example embodiment, the bitcell includes a source region in a well, the source region having a first conductivity type. The well also includes a drain region, also having a first conductivity type. The drain region is implanted with a halo region of a second conductivity type opposite to the first conductivity type. A channel region sits in the well between the drain region and the source region. A floating gate rests above the well and covers the channel region and at least part of the source and drain regions. An oxide layer sits between the floating gate and the well. The oxide layer includes a plurality of oxide channels on two lengthwise sides of the channel region. A capacitive region is formed in the source region below the floating gate lengthwise alongside the oxide channels, where the capacitive region is implanted with a dopant of a first conductivity.

In another example embodiment, the bitcell includes a source region in a well, the source region having a first conductivity type. The well also includes a drain region, also having a first conductivity type. The drain region is implanted with a halo region of a second conductivity type opposite to the first conductivity type. A channel region sits in the well between the source region and the drain region. A capacitive region is formed in the source region by implanting additional carriers of the first conductivity type using a shallow well mask step. The shallow well mask step is added prior to the formation of a floating gate on top of the well, where the floating gate covers the channel region and at least part of the source and drain regions. In an example embodiment of a complementary metal-oxide-semiconductor manufacturing processes (CMOS process) for generating the bitcell, the capacitive region is formed by the addition of a shallow well mask step to the standard CMOS process, where the floating gate is formed after the shallow well mask step.

DETAILED DESCRIPTION

Embodiments relate to a nonvolatile memory ("NVM") bitcell with reduced size and enhanced capacitive coupling between a source and the floating gate. The bitcell may use band to band tunneling, channel hot injection impact ionized hot electron injection, and/or enhanced source-floating gate capacitive coupling to read, write, or erase the bitcell. The bitcell may be created using a standard complementary metal-oxide-semiconductor manufacturing processes ("CMOS processes") without any additional process steps, reducing the cost and time associated with fabricating a semiconductor device incorporating the NVM bitcell. The bitcell may also be created by adding an additional photo/implant step to the standard CMOS process.

"NVM bitcell," "bitcell" or "bit" described herein refers to CMOS type (i.e., transistor based) nonvolatile memory. CMOS NVM bitcell is distinguishes from other types of NVM memory such as magnetic memory, such as is found in floppy disks, or optical memory such as is found in CDs or DVDs. NVM bitcells are produced using a CMOS process that includes a number of process steps in a fabrication facility (fab).

Example of Conventional NVM Bitcell

In an NVM device, a memory block encompassing many bitcells of memory. The memory block often includes a mechanism to select which bit is to be written, read, or erased in order to distinguish each bit from the other bitcells in the block. In some cases, the selection mechanism is implemented within each bit of memory. While implementing the selection mechanism for each bit allows for read, write and erase control over each individual bit, the added mechanism to the NVM bitcell significantly increases the size of the NVM bitcell, as illustrated in FIG. 1.

Figure 1:
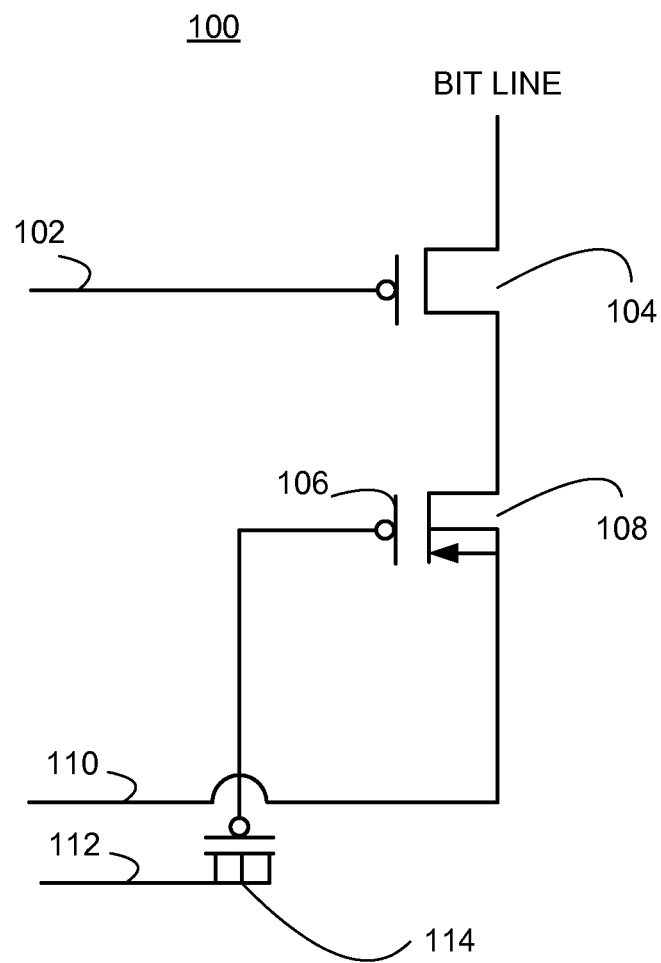
FIG. 1 is a circuit diagram of a conventional NVM bitcell.

FIG. 1 is a circuit diagram of an existing NVM bitcell 100. The NVM bitcell 100 of FIG. 1 incorporates select transistor 104 to select the NVM bitcell 100 for reading, writing, and erasing. In order to write to the bitcell 100, the bitcell 100 is first selected by turning on select transistor 104 by providing a select signal via line 102. To write a bit to memory transistor 108, carriers are added to floating gate 106 by a transport mechanism called Channel Hot Injection (CHI) if the memory transistor 108 is an N-type Metal-Oxide-Semiconductor Field-Effect Transistor (MOSFET), and Impact Ionized Hot Electron Injection (IHEI) if the memory transistor is a P-type MOSFET.

If the memory transistor 108 is a P-type MOSFET as illustrated in FIG. 1, the process of writing a bit includes inducing Impact-ionized Hot Electron Injection (IHEI) to add electrons to the floating gate 106, thereby changing the charge value of the floating gate 106 above or below a threshold charge level. To write the bit via the IHEI transport mechanism, WELL/SOURCE voltage 110 is set to a voltage that drops the source drain voltage $V_{SD}$ of the memory transistor 108. A large drop in $V_{SD}$ establishes a high intensity electric field running from the source of the memory transistor 108 to the drain of memory transistor 108. The electric field causes holes to accelerate from the source of the memory transistor 108 towards the drain of the memory transistor 108. The high energy holes have collisions or impacts that create hole/electron pairs. Some of the electrons created in the impacts have enough energy (are hot enough) to be injected onto the floating gate.

The P-type memory transistor 108 turns "on" when the floating gate voltage is at least a threshold $V_T$ below the well voltage $V_w$. The threshold voltage $V_T$ is determined by the structure of the memory transistor 108 such as the doping concentration in the channel region, the size of the channel region in the substrate between the source and the drain of the memory transistor 108, and the thickness of the gate dielectric isolating the floating gate 106. When the memory transistor 108 is turned on, a conductive channel is established within the substrate portion of the memory transistor 108 beneath the gate dielectric. The accelerated holes collide with the substrate lattice, creating electrons with sufficient energy to tunnel across the gate dielectric and enter the floating gate 106. The transistor 108 switches from a first logical state (e.g., a non-charged "0" state) to a second logical state (e.g., a charged "1" state) when a sufficient number of electrons are injected onto the floating gate 106.

To revert the transistor 108 from the second logic state back to the first logic state (referred herein as "erasing" the bitcell), electrons are removed from the floating gate 106 to effectively discharge the charge stored in the floating gate 106. In the example of FIG. 1, transitioning the floating gate 106 to the first logic state is accomplished by having electrons tunnel via Fowler-Nordheim tunneling from the floating gate 106 to ERASE node 112 (i.e., the semiconductor substrate portion of erase transistor 114). To induce Fowler-Nordheim tunneling, a large positive voltage is placed on the ERASE line 112 by creating a strong electric field that runs from the semiconductor substrate portion of erase transistor 114 to the floating gate 106. This large positive voltage promotes the tunneling of electrons from the floating gate 106 to the semiconductor substrate portion of the memory transistor 114.

General Overview of Example Embodiments

Embodiments save space compared to conventional NVM bitcells, in part, by removing the select transistor and 104 and erase transistor 114. The selection and erasure mechanism may instead be integrated into the memory transistor 108 itself, through specialized design of the physical layout of the memory transistor 108.

Figure 2A:
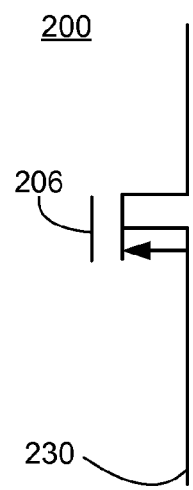
FIG. 2a is a circuit diagram of a NVM bitcell according to one embodiment.

FIG. 2a is a circuit diagram of a NVM bitcell 200 according to one embodiment. The NVM bitcell 200 of FIG. 2a saves space over conventional NVM bitcells (i.e. it is more dense), because all functions of the bitcell have been incorporated into a single memory transistor 200. In the description of FIG. 1 above, it was useful to distinguish the bitcell from the transistors that made up the bitcell, because there was more than one transistor in each bitcell circuit. In contrast, the terms "NVM bitcell" and "memory transistor" may be used interchangeably in embodiments described below with reference to FIGS. 2a through 5b because only a single transistor is included in each NVM bitcell.

Figure 2B:
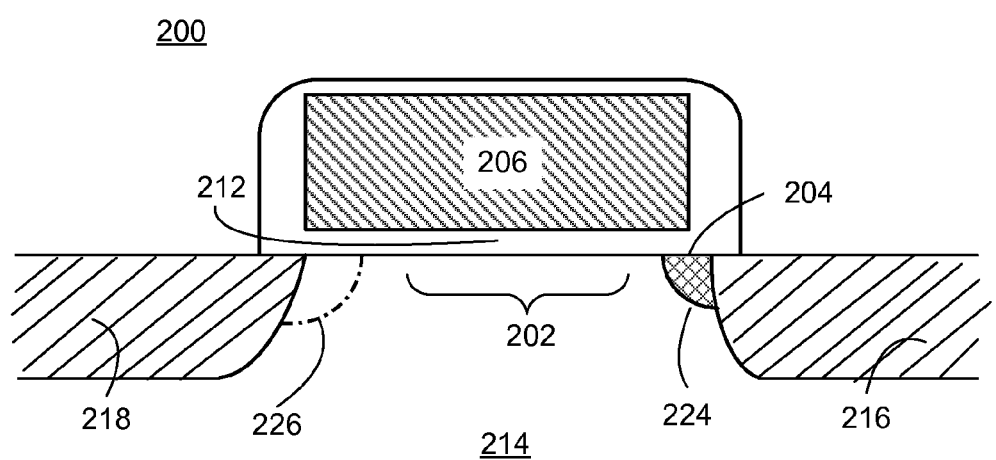
FIG. 2b is a cross sectional diagram of a NVM bitcell according to one embodiment.

The bitcell 200 can perform read, write, and erase operations by controlling the voltages which are applied at its source and drain, and by controlling the physical layout of the various components of memory transistor 200 created during the CMOS process. Read, write, or erase operations are performed on the bitcell by controlling the occurrence of two different carrier (i.e., electrons or holes) transport mechanisms: (i) CHI or IHEI as described above with reference to FIG. 1, and (ii) band-to-band tunneling, which is described below with reference to FIGS. 2a and 2b. In the bitcell of FIGS. 2a and 2b, the source 230 line that controls voltage to the source of the bitcell is also the line that is used for selection and erasure. As a consequence of removing the separate select device and integrating the select mechanism into the floating gate of the bitcell 200, the bitcell is much smaller than the bitcell referenced in FIG. 1.

FIG. 2b is a cross sectional diagram of a NVM bitcell 200 of FIG. 2a, according to one embodiment. The memory transistor 200 is embodied as a N-type floating gate MOSFET. In this embodiment, the floating gate 206 sits on top of a gate oxide (or gate dielectric) 212, which itself sits on top of a P-well inside a P-substrate 214. In one embodiment, the gate oxide 212 has a thickness between 50 and 140 angstroms. The P-well 214 is doped with additional donor atoms (N+) on both sides of the floating gate 206 to create the source region 216 and the drain region 218 of the MOSFET 200. The channel region 202 is a shallow region of the P-well 214 close to the gate dielectric 212 between the source 216 and the drain 218 that is characterized by the flow of carriers between the source 216 and the drain 218 depending upon voltage at the source 216, drain 128 and floating gate 206. In another embodiment, the memory transistor 200 is embodied as an P-Type floating gate MOSFET.

The memory transistor 200 is an asymmetric MOSFET meaning that the memory transistor 200 has different doping profiles of acceptor dopants and donor dopants at the source 216 and the drain 218. Doping a substrate adjusts the concentration of atoms in the doped region, thereby adjusting the concentration of carriers in that region.

In one embodiment, source 216 includes a lightly doped drain (LDD) region 224. The LDD region 224 has the highest dopant concentration at or very close to the surface of the well 214, and drops further into the well. In one example N-type embodiment, drain 218 is doped to form a shallow heavily doped N region 226. In another example embodiment, there are both an LDD and a P-type halo in region 226. A halo implant 226 is of the same polarity as the well 214 and is of opposite polarity as the LDD implant 224. The halo region surrounds the LDD region. The halo implant 226 dopant concentration is typically between that of the LDD region 224 and well 214 concentrations.

The asymmetric doping profile allows bitcell 200 to operate at more than one voltage level based on the voltage at the source and the drain. Traditionally, a transistor may have been referred to as a "1.8V device" or a "5V device" meaning that the transistor operates at the specified voltage regardless of whether the voltage is applied to the source or the drain. Bitcell 200, in contrast, is a hybrid transistor. An asymmetric doping profile allows the bitcell to operate at more than one voltage, depending upon whether voltage is applied to the source or the drain. For example, bitcell 200 may comprise a 1.8V NMOS and a 5V NMOS in the same device. Alternatively, the bitcell 200 may be a 1.8V PMOS and a 5V PMOS in the same device. The bitcell 200 may function at other voltages as well, including 2.8V and 3.3V, for example.

A 5V device will typically have a well 214 concentration of $10^{17}$ dopant atoms/cm$^3$, a LDD region 226 concentration of $10^{19}$ and a source/drain 216/218 concentration of $10^{20}$. The LDD region 224 of a 5V device typically has a graded dopant concentration profile. A graded dopant concentration profile gradually changes in dopant concentration between the dopant concentration of the channel region 202 and the dopant concentration of the LDD region 224 (i.e., it gradually fades into the well 214). A 1.8V device will typically have a well concentration of $10^{17}$ dopant atoms/cm$^3$, a LDD region 224 concentration of $10^{20}$, a halo region 226 concentration of $10^{18}$ and a source/drain concentration of $10^{20}$. The LDD region in 226 of a 1.8V device typically has a very abrupt dopant concentration profile. An abrupt dopant concentration profile switches between the dopant type of the LDD to the dopant type of the halo inside region 226 over a very short distance.

The LDD region 224 of an IO device may be referred to as either the HV-LDD or IO-LDD. The halo region 226 may also be referred to as an LV-LDD implant. When the concentration of the LDD region 226 is similar to the source/drain 216/218 concentration it is sometimes called a S/D-ext (Source/Drain-Extension).

The asymmetric doping profiles of the LV-LDD and HV-LDD regions 224 and 226 create very different diode characteristics within the NVM bitcell 200. The LV-LDD 226 with its higher doping (than the well 214) and abrupt dopant concentration profile will have higher electric fields in the diode. The higher electric fields of the LV-LDD region 226 will cause the junction to break down sooner and therefore have greater BTBT than an undoped drain, or than the HV-LDD region 224.

By doping the drain 218 to include P-halo 226, the transistor 200 will have a higher intensity of the electric field beneath and near the edges of the floating gate 206 near the drain region 218 when the transistor 200 is turned off. The presence of more dopants in the LDD/halo region 226 results in a smaller depletion region, which in turn results in a higher intensity electric field in the drain region 218. The electric field strength is also influenced by the voltage at the floating gate 206. If the floating gate 206 is at a voltage where the transistor 200 is turned off, the floating gate 206 draws carriers such that it further increases the electric fields in the diode depletion region below the floating gate 206. When the floating gate 206 is biased to turn the device off, the floating gate 206 attracts carriers of the opposite polarity. Thus, when the floating gate is biased to be off, the floating gate 206 attracts carriers that will cause the floating gate 206 to turn on.

A stronger electric field and a smaller depletion region width in the diode between the channel region 202 and LDD region 226, causes the transmission of carriers between the floating gate 206 and the drain region 218 through the transport mechanism of band-to-band tunneling (BTBT), BTBT occurs when electrons tunnel through the narrow depletion region. The electrons transmitted by BTBT pick up energy from the high electric field of the depletion region, collide with other elections, and create hot hole/hot electrons pairs. Either the hot holes or the hot electrons will be attracted to the floating gate 206, depending on the voltage on the floating gate 206. Some of the hot carriers produced by BTBT have enough energy to cross through the gate oxide 212 onto the floating gate 206.

The bitcell 200 may use BTBT to write a bit to the floating gate 206. For NMOS devices 200, BTBT injects holes onto the floating gate 206 turning the transistor 200 on and writing a bit to the transistor 200. CHI injects electrons onto the floating gate 206, turning the transistor 200 off. For PMOS devices, BTBT injects holes onto the floating gate 206 turning the transistor 200 on and writing a bit to the transistor 200, IHEI injects electrons onto the floating gate 206 turning the transistor 200 off.

Capacitive coupling between the floating gate 206 and the source 216, increased due to HV-LDD region 224, allows the voltage on the floating gate 206 to track the voltage of the source 216 with an offset. The greater the capacitive coupling between the gate and source, the more closely the floating gate voltage 206 will track the voltage at the source 216. For example, if the capacitive coupling is extremely high, the gate voltage will be very close to the source voltage (e.g., the gate voltage may be 90% of the source voltage). If the capacitive coupling is moderate, the gate voltage may only be 50% of the source voltage. If there is no capacitive coupling, the voltage on the gate will be determined according to the ordinary MOSFET mechanics. The capacitive coupling between the source and the gate may be anywhere between 10% and 90%. As the capacitive coupling between the floating gate voltage and the source voltage increases, a lower source voltage is required to achieve the same floating gate voltage, thereby reducing the energy consumption of the bitcell.

In contrast, standard CMOS logic transistors avoid creating any capacitance between the gate and the source or the drain to optimize the transistor's performance. Standard logic transistors also need to reduce the drain leakage caused by BTBT, also known as GIDL. To reduce gate to drain capacitance and resistance a highly doped LDD with an abrupt transition is desirable. To minimize BTBT and GIDL an lightly doped LDD with a graded junction is desirable. At higher voltages, such as 5V, BTBT and GIDL are dominate so a light graded LDD is used. At lower voltages, such as 1.8V, where GIDL is much smaller, a heavily doped abrupt junction is preferred.

In one embodiment, the bitcell 200 is part of an array of bits, where the drains of the bits are connected the columns of the array, and the sources of the bits are connected to the rows of the array. The capacitance with respect to the source 216 is used to select the row of the bitcell to be read. For an NMOS device, the bitcell has a floating gate voltage below the voltage threshold $V_T$, and the bitcell is in the off state. For example, if the bitcell 200 to be read has a threshold voltage $V_t$ of 0.5 volts, a logical state of 0 (i.e., the bitcell 200 is in the off state) may be represented by a floating gate voltage of −1 volts (assuming the well 214, drain 218, and source 216 all are set to 0 volt bias). In contrast, a logical state of 1 (i.e., the bitcell is in the on state) may be represented by a floating gate voltage of 0 volts. Because the floating gate voltages are either at −1 volts or 0 volt, all cells in the row are turned off when the source voltages of the transistors are at 0 volts.

When reading from a row, the source voltage of the row is raised to a level that causes those transistors with a logical state of 1 to turn on, whereas those transistors with a logical state of 0 to remain off. In one embodiment where the source has 50% capacitive coupling to a floating gate 206, a transistor that is turned off has −1V on its floating gate 206, whereas a transistor that is turned on has 0V on its floating gate 206, assuming that the source voltage is at 0V. If the source voltage is raised to 2 volts, the bits storing the logical state of 0 will experience an increase in floating gate voltage from −1V to 0V, thus these transistors remain turned off. In contrast, the bits storing the logical state of 1 will experience increase in floating gate voltage from 0V to +1V (which is above the $V_T$ of the device), which turns these transistors on. With the bitcells in a row being either turned on or off depending on floating gate voltage (along with bits in all other rows being turned off), a sense amplifier (not shown) may read the logical states of individual bits in a row. Tables 1 and 2 set forth below illustrate read, write, and erase operating voltages for NMOS and PMOS embodiments, respectively.

TABLE 1

NMOS Bitcell (Well at 0 V)

| Operation if bitcell row/page is selected | Drain (Column) | Source (Row) | Transport Mechanism |
|---|---|---|---|
| Read Selected Row | 0 V (pre-charge) | 3 V ($V_{read}$) | Bits in the selected row programmed with a logical 0 are off. Bits with a logical 1 are on. No charge transfer occurs (X→X). |
| Read Unselected Row | 0 V (pre-charge) | 0 V ($V_{read}$) | All bits will be off. No charge transfer occurs (X→X). |
| Erase Selected Row & Bit | 0 V | 7 V ($V_{erase}$) | CHI per bit, injecting electrons onto floating gate turning off the cell (1 → 0). |
| Inhibit Erase of Selected Row & Bit No State Change | 2-4 V or float ($V_{inhibit}$) | 7 V ($V_{erase}$) | Floating gate is previously programmed during programming operation. With this bias condition no charge transfer occurs for the selected bit, so floating gate state remains unchanged. (X → X) |
| Write Selected Page | 6 V ($V_{prog}$) | 0 V | BTBT, per page (column) (0 → 1) |
| Write Unselected Page | 0 V ($V_{prog}$) | 0 V | No charge transfer occurs (X→X). |

TABLE 2

PMOS Bitcell

| Operation if bitcell row/page is not selected | Drain (Column) | Source (Row) | Well | Transport Mechanism |
|---|---|---|---|---|
| Read Unselected Row | 3 V (pre-charge) | 3 V | 3 V | No charge transport during read (X→X) |
| Read Selected Row | 3 V (pre-charge) | 0 V | 3 V | No charge transport during read (X→X) |
| Erase Selected Page | 0 V | 7 V | 7 V | BTBT hot hole injection onto floating gate turns bit off (1→0) |
| Erase Unselected Page | 0 V or 3 V | 3 V | 7 V | No charge transport (X→X) |
| Write Bit On Selected Row | 0 V | 0 V | 7 V | IHEI injection of hot electrons onto floating gate turns bit on (0→1) |
| Inhibit Write of Bit On Selected Row | 3 V | 0 V | 7 V | No charge transport, leave bit in prior state (X→X). |
| Write Unselected Page | 0 V or 3 V | 2-4 V ($V_{inhibit}$) | 7 V | No charge transport (X→X) |

Example Layout Created with No Additional Process Steps

Figure 3A:
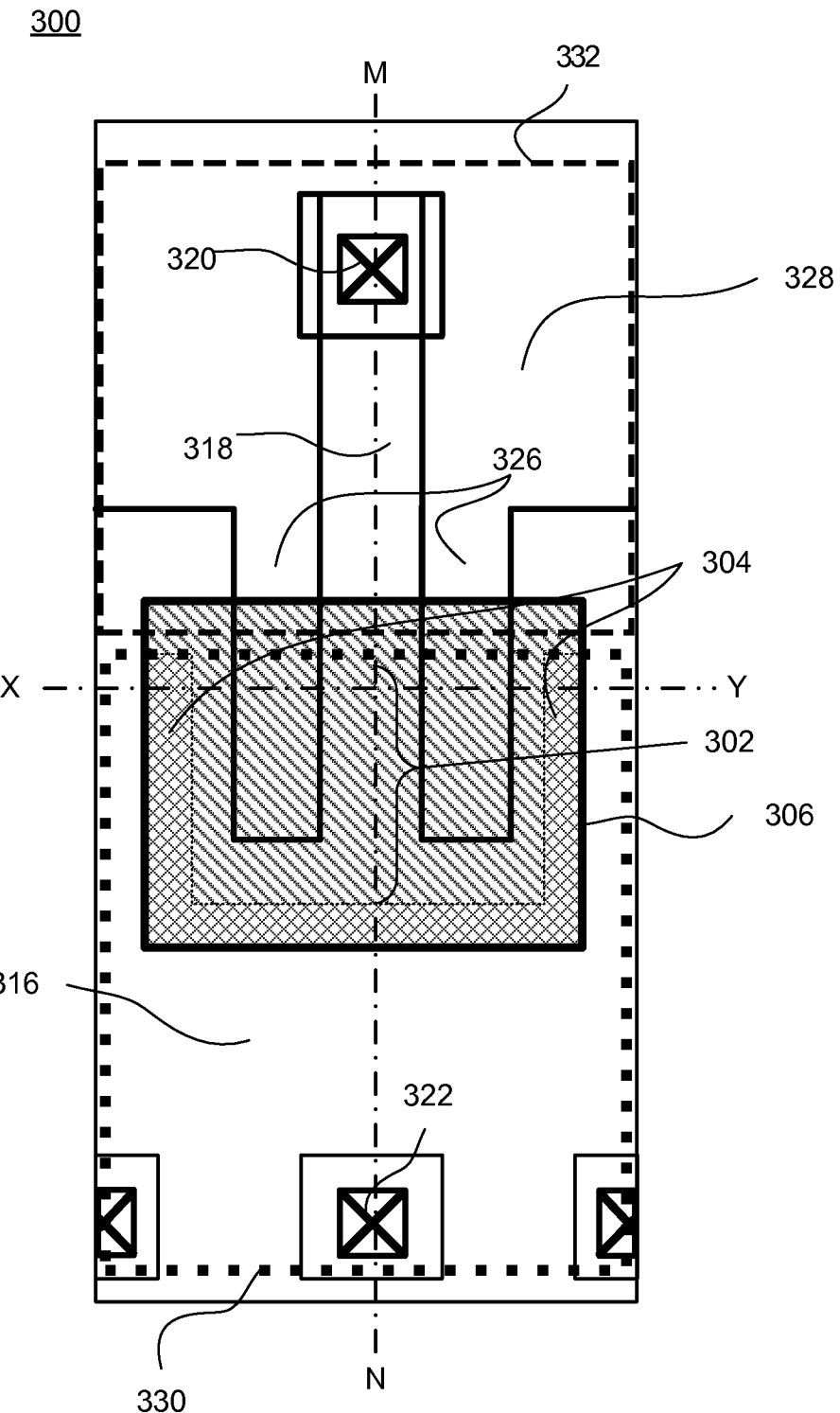
FIG. 3a is a plan view of a NVM bitcell according to one embodiment.

FIG. 3a is a plan view of a NVM bitcell 300 according to one embodiment. The NVM bitcell 300 with a first layout can be fabricated using the standard CMOS process without any additional process steps. The first layout increases the capacitive coupling between the source and the floating gate. In a P-type embodiment, the NVM bitcell 300 includes a rectangular floating gate 306 that sits on top of a N-well 314. The N-well 314 may sit inside either a N or P type substrate, not shown.

Figure 3B:
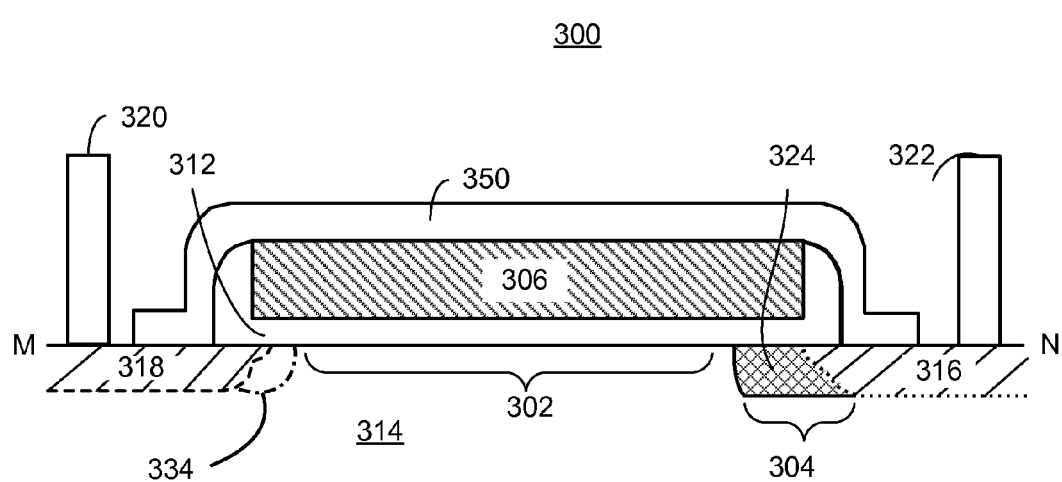
FIG. 3b is a cross sectional diagram of the NVM bitcell of FIG. 3a taken along line M-N, according to one embodiment.

In one embodiment, the N-well 314 sits beneath the entirety of device 300 (not shown in FIG. 3a, see FIG. 3b). The bitcell 300 has asymmetric doping between the source 316 and the drain 318. The source region 316 extends partway underneath the floating gate 306 on the side of the floating gate 306 closest to the source contact 322. The source region 316 also extends partway underneath the floating gate 306 on the lateral sides of the floating gate 306 not facing the source contact 322 or drain contact 320.

The channel region 302 of N-well 314 extends lengthwise along a straight line underneath the floating gate 306 between the source region 316 and drain region 318. The channel region 302 is shorter than the full width of the floating gate 306 crosswise, though the exact width may be variable.

At the drain contact 320, the drain region 318 extends straight out from the drain contact 320 towards the channel region 302. In contrast to the region around the source contact 322, the region 318 around the drain contact 320 is filled with a non-conductive oxide 328 on three sides. In another embodiment another bitcell is mirrored around the drain contact 320, thus sharing drain contact 320 with another bitcell. In this embodiment, oxide 328 is on two sides of the drain rather than three. That is, the non-conductive oxide 328 surrounds the drain contact 320 and drain region 318. The drain region is bounded by the edge of the bitcell and by the source region 316. The non-conductive oxide 328 and the source region 316 border each other at a point in between the source contact 322 and drain contact 320 where the sides of the floating gate 306 reside mostly above source region 316 rather than non-conductive oxide 328. In one embodiment, the sides of the floating gate 306 reside entirely above the source 316 rather than the non-conductive oxide 328. Floating gate 306 may have a salicide blocking layer 350 on top of it.

Figure 4:
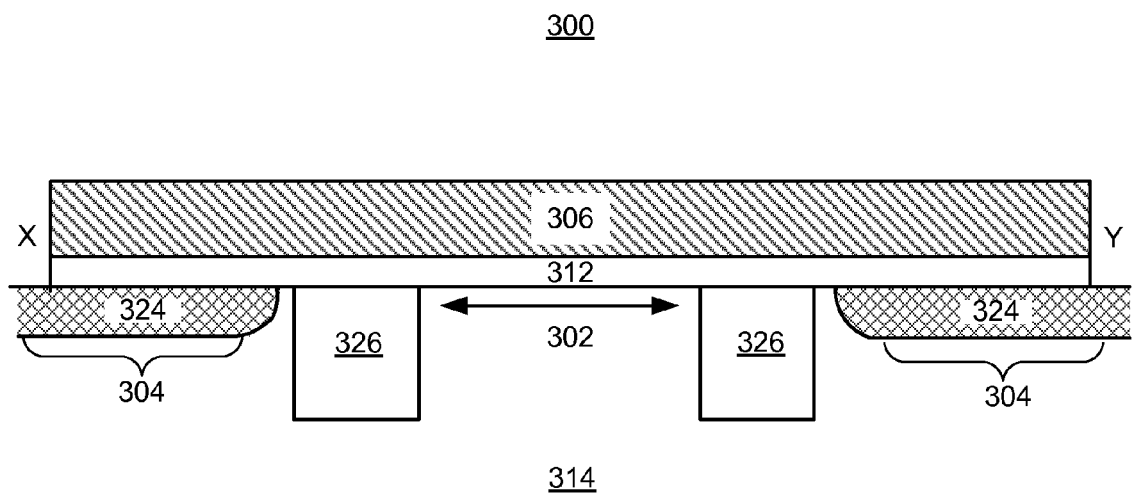
FIG. 4 is a cross sectional diagram of the NVM bitcell of FIG. 3a taken along line X-Y, according to one embodiment.

Additionally, two oxide channels 326 extend underneath the floating gate 306 from the top edge of the floating gate 306 from the non-conductive oxide 328, alongside either side of the channel region 302 as shown in FIG. 4. In one embodiment, the two oxide channels 326 terminate underneath the floating gate 306 prior to the bottom edge of the floating gate 306 closest to the source region 316. The channel region 302 is bordered on the sides at some points by the two oxide channels 326.

The source 316 and drain 318 are formed during the standard CMOS process by doping the N-well 314 with additional carriers for the bitcell to function as a transistor when a voltage is applied to either the source or drain. The doping of the source 316 and drain 318, especially with regard to the portions of the source and drain underneath the floating gate 306 next to the channel region 302, are described above with respect to FIG. 2.

Capacitive coupling between the source 316 and the floating gate 306 is enhanced by doping the N-well 314 near the source 316 to have many carriers. The carriers are added through implantation via a HV-LDD mask 330 partway over the floating gate 306 and covering all the way to the source contact 322. The HV-LDD mask 330 is a high angle (or high energy) mask so that the area of the N-well 314 doped by the HV-LDD mask extends partway underneath the bottom and side edges of the floating 306. The doping results is two large capacitive regions 304 in the source region 316 that are isolated from the drain 318 by the oxide channels 326, non-conductive oxide 328, and channel region 302. In one embodiment, the HV-LDD mask 330 has a high angle implantation of up to 45 degrees. In one embodiment, the electrons are implanted at the same depth as the source 316 to minimize resistance and increase source/drain to well breakdown.

FIG. 3b is a cross sectional of the NVM bitcell 300 taken along line M-N according to one embodiment. The floating gate 306 sits on top of a gate oxide 312, which sits on top of the N-well 314. The drain 318 is doped through the use of a LV-LDD mask 332 to have a higher doping concentration and to form P-halo 334. The LV-LDD in the drain 318 and halo 334 combine to form a highly doped abrupt PN junction. The source 316 is doped through the use of a HV-LDD mask 330 to create HV-LDD implant 324. The source's 316 lower doped region 324 is a graded PN junction. The more graded nature of the source 316 causes it to extend further under the gate 306 than the drain 318 does. This extension under the gate forms a capacitive region 304. The higher doping and more abrupt junction of drain 318 and halo 334 causes BTBT to occur at a significantly lower voltage than it does on the source 316. The channel region 302 extends between the P doped regions 318 and 316 along the straight portion of the N-well 314 underneath the floating gate 306. Due the layout of the device shown in FIG. 3a, the source 316 has a much larger surface area than the drain 318.

FIG. 4 is a cross sectional diagram of the NVM bitcell 300 taken along line X-Y in FIG. 3a, according to one embodiment. Large capacitive regions 304 are created in the bitcell 300 that is built and doped as described above with reference to FIGS. 3a and 3b. The channel region 302 is isolated from the capacitive regions 304 by the oxide channels 326. Due to the high angle of the HV-LDD implantation 330, the HV-LDD implant 324 extend a significant distance underneath the floating gate 306, creating a large source-gate capacitance.

Example Layout Created with One Additional Mask Step

Figure 5A:
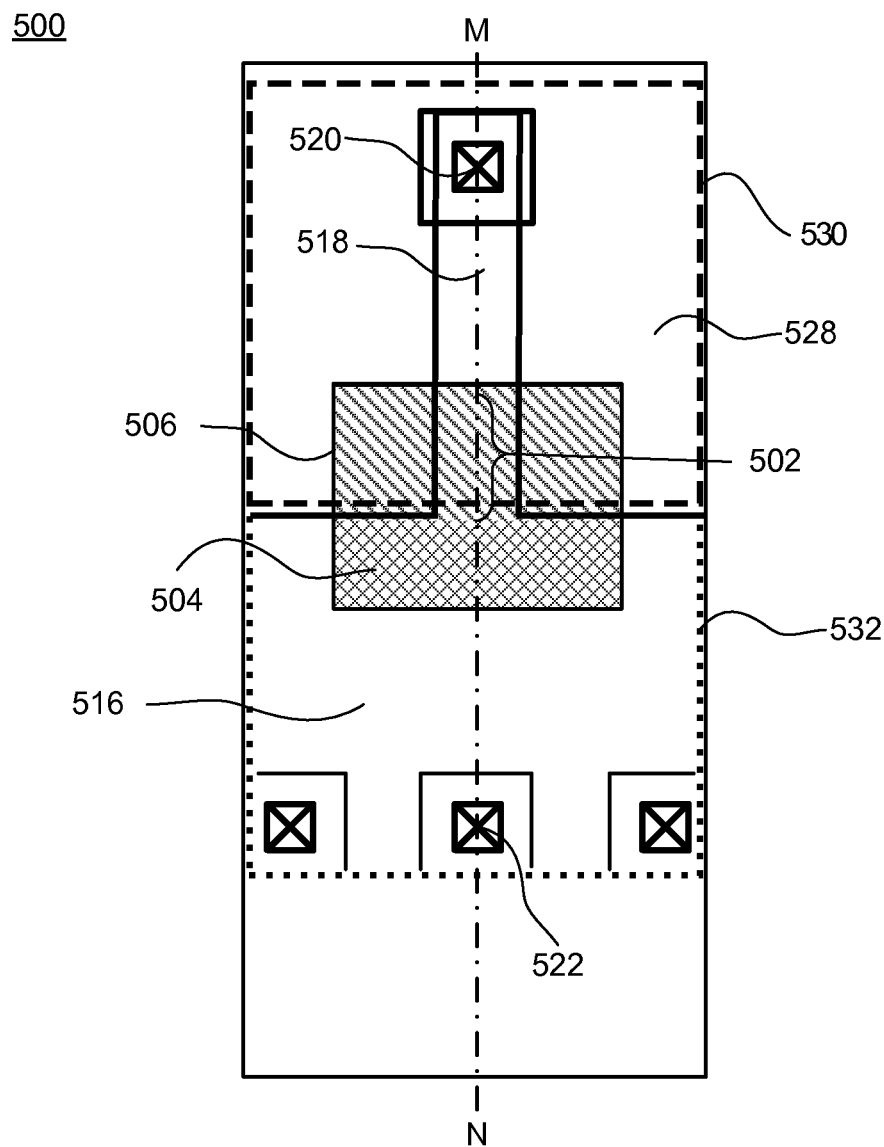
FIG. 5a is a plan view of a NVM bitcell according to another embodiment.

FIG. 5a is a plan view of a NVM bitcell 500 according to one embodiment. The NVM bitcell 500 with a second layout can be is fabricated using the standard CMOS process, plus one additional mask step. In the CMOS process, the additional mask step is added before the floating gate oxide 512 or floating gate 506 is added on top of the well 514. The second layout also increases the capacitive coupling between source 516 and floating gate 506. In a P-type embodiment, the NVM bitcell 500 includes a rectangular floating gate 506 that sits on top of a N-well 514. In a N-type embodiment, the NVM bitcell includes a P-well instead.

In one embodiment, the N-well 514 sits beneath the entirety of device 500 (not shown in FIG. 5a, see FIG. 5b) The bitcell 500 has asymmetric doping between the source 516 and the drain 518. The source region 516 extends partway underneath the floating gate 506 on the side of the floating gate 506 closest to the source contact 522, and all the way past the lateral sides of the floating gate.

The channel region 502 of N-well 514 extends lengthwise along a straight line underneath the floating gate 506 between the source region 516 and drain region 518. The channel region 502 is shorter than the full width of the floating gate 506 crosswise, though the exact width may be variable.

The drain region 518 extends straight out from the drain contact 520 to the channel region 502. In contrast to the source region 516, the drain region 518 is surrounded by a non-conductive oxide 528. The non-conductive oxide 528 and the source region 516 border each other at a point in between the source contact 522 and drain contact 520 where the sides of the floating gate 306 reside partway above both the source region 516 and the non-conductive oxide 528. In contrast to the first layout, in the second layout there are no oxide channels extending underneath the floating gate 506. The channel region 502 is bordered on the sides by the non-conductive oxide 528.

Capacitive coupling between the source 516 and the floating gate 506 is enhanced by doping the source 516 to have many more dopants. The source is doped by adding a shallow well mask step 532 to the CMOS process before the gate 506 or gate oxide 512 are added. This step is not performed in the standard CMOS process. The shallow well mask step 532 results in shallow well 524 which is the same polarity as the source 516. The shallow well has higher dopant concentration than the well 514. The result of the doping is a large capacitive region 504 on the source side of the bitcell beneath the floating gate 506. In one embodiment, the shallow well 524 is implanted at the same depth as the source 516 in order to minimize resistance and increase source/drain to well breakdown. In one embodiment, the shallow well 524 comprises a doping of $10^{19}$ atoms/cm$^3$ concentration.

Figure 5B:
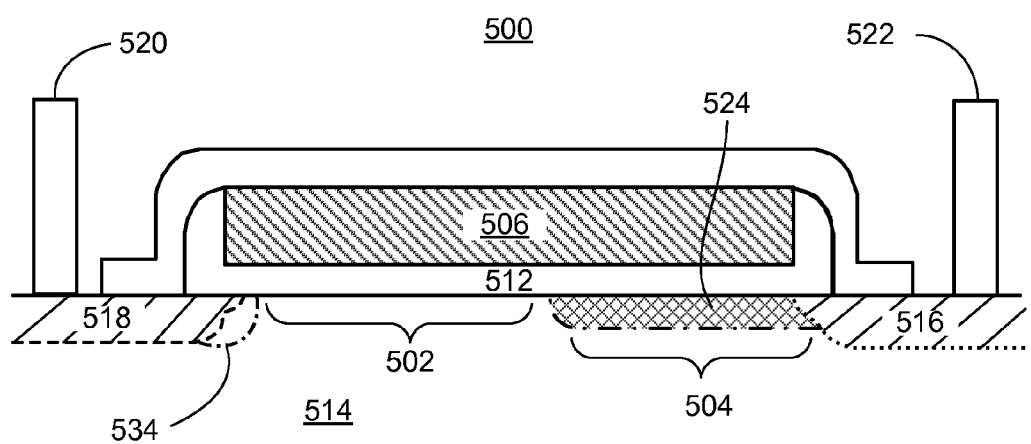
FIG. 5b is a cross sectional diagram of the NVM bitcell of FIG. 5a taken along line M-N, according to one embodiment.

FIG. 5b is a cross sectional diagram of the NVM bitcell 500 taken along line M-N according to FIG. 5a, according to one embodiment. In an N-type embodiment, the floating gate 506 sits on top of a gate oxide 512, which sits on top of the P-well 514. The drain 518 is doped through use of a LV-LDD mask 530 to have additional holes, forming P-halo 534. The source 516 is doped to have additional electrons using a shallow N-well mask 532 prior to the addition of the floating gate, forming shallow N-well 524 and capacitive region 504. The channel region 502 extends along the straight portion of the P-well 514 between the doped source 516 and drain 518 underneath the floating gate 506.

Process for Creating Example Layout with Additional Mask Step

Figure 6:
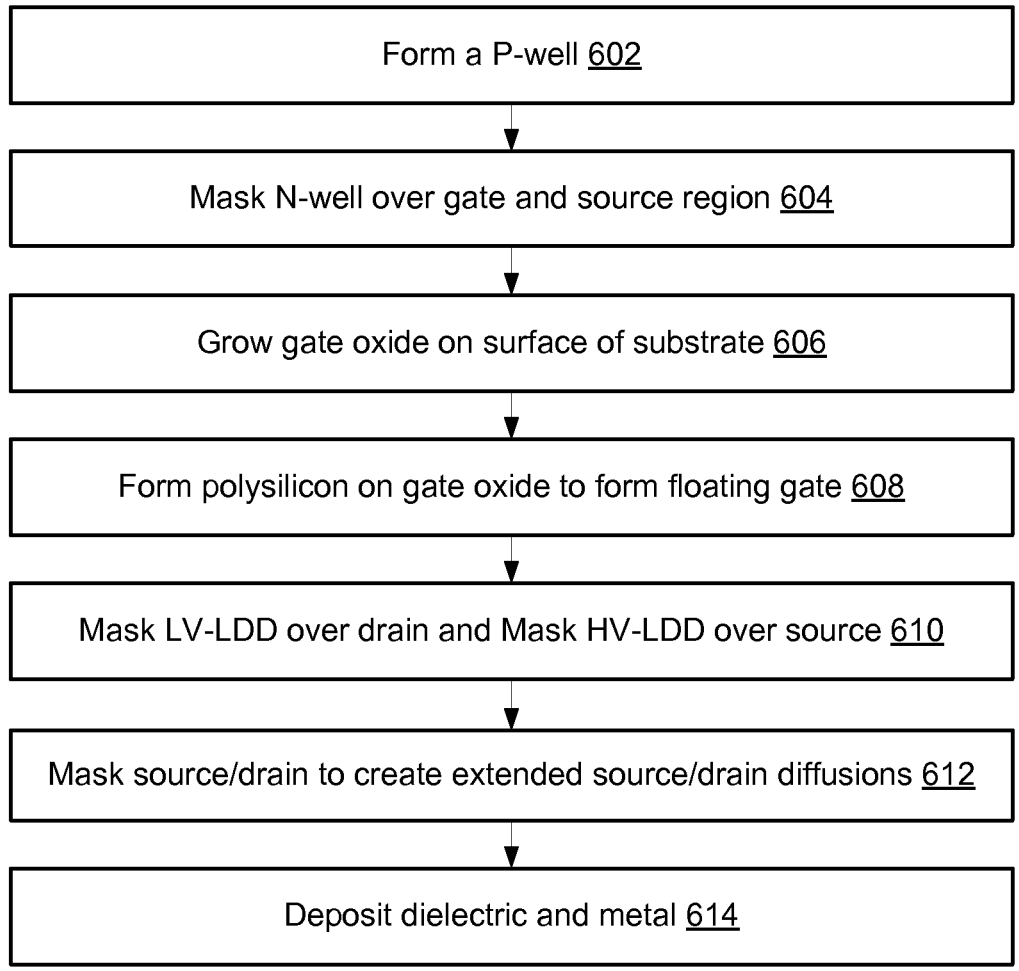
FIG. 6 is a flow chart of a CMOS process to produce a NVM bitcell of FIG. 5a, according to one embodiment.

FIG. 6 is a flowchart of a CMOS process to produce the NVM bitcell 500 of FIGS. 5a and 5b, according to one embodiment. As described above with reference to FIGS. 5a and 5b, the NVM 500 differs from the standard CMOS process through the addition of an extra shallow well mask step prior to the formation of the gate oxide 512 in the bitcell 500. With the additional mask step, the CMOS process is described as follows.

First, the P-well is formed 602 in the substrate. The P-well is formed so as to take the shape described above as described above with reference to FIG. 5a. A shallow N-well mask is added 604 over the portion of the P-well 514 that will later become the source 516. The shallow N-well mask implants 604 electrons in the source region 516 of the P-Well 514.

A gate oxide is grown 606 on the surface of the P-well. The thickness of the gate oxide 512 will determine some properties of the NVM bitcell. For example, a thin gate oxide would be on the order of 30 angstroms. In another example, a thick gate oxide would be on the order of 120 angstroms. Patterned polysilicon is deposited patterned and etched 608 on the gate oxide to form the floating gate.

A LV-LDD mask implants 610 additional acceptors over the drain, and a HV-LDD mask implants 610 additional acceptors over the source. An additional mask of acceptors creates extended source and diffusions 612. Pre-metal dielectric, contacts, metallization including interlayer dielectrics and metal Vias, and passivation are deposited 613.

Additional Considerations

The disclosed embodiments beneficially allow for a NVM bitcell of reduced size. The reduced size NVM bitcell can be packed into a higher density NVM memory block. The NVM bitcell may also be produced at low cost, because the NVM bitcell can be created using a standard CMOS process without additional process steps. Further, the NVM bitcell functions at a number of different voltages ranges including, for example, 1, 1.2, 1.8, 2.5, 3.3, and 5 volts.

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
   a source region of a second conductivity type in a well of a first conductivity type;
   a drain region of the second conductivity type in the well, the drain region implanted with a halo region of the first conductivity type, a first boundary between the drain region and the halo region having a first doping gradient;
   a channel region in the well between the drain region and the source region;
   a capacitive region formed in the source region and comprising a dopant of the second conductivity type, a second boundary between the source region and the channel region having a second doping gradient that changes more gradually than the first doping gradient; and
   a floating gate above the well and covering the channel region, at least a portion of the drain region and the capacitive region, a gate-source capacitance between the floating gate and the source region increased relative to a gate-drain capacitance between the floating gate and the drain region by the capacitive region, an entire bottom surface of the floating gate being substantially flat.

2. The non-volatile memory bitcell of claim 1, wherein the dopant in the channel region and below the source and drain regions is selectively implanted with a well mask prior to the creation of the floating gate.

3. The non-volatile memory bitcell of claim 2, wherein the dopant is implanted to the same depth within the well as the source region.

4. The non-volatile memory bitcell of claim 2, wherein the dopant is implanted to a depth within the well shallower than a deepest portion of the source region.

5. The non-volatile memory bitcell of claim 1, wherein an oxide region surrounds the drain region on two sides and is bordered by the source region, the capacitive region, and the channel region.

6. The non-volatile memory bitcell of claim 1, wherein the halo region comprises a second dopant implanted by a low voltage lightly doped drain mask.

7. The non-volatile memory bitcell of claim 1, wherein the floating gate and the capacitive region have capacitive coupling such that a voltage level of the floating gate is at least 30% of a voltage level of the capacitive region when the floating gate is an off state.

8. The non-volatile memory bitcell of claim 1, wherein the channel region has the same dopants in the same concentrations as the well.

9. The non-volatile memory bitcell of claim 1, wherein the channel region is configured to extend lengthwise along a single straight line underneath the floating gate between the source region and the drain region.

10. A non-volatile memory bitcell comprising:
    a source region of a second conductivity type in a well of a first conductivity type;
    a drain region of the second conductivity type in the well, the drain region implanted with a halo region of the first conductivity type, a first boundary between the drain region and the halo region having a first doping gradient;
    a channel region in the well between the drain region and the source region;
    a capacitive region formed in the source region and comprising a dopant of the second conductivity type, the dopant implanted to a depth within the well shallower than or equal to a deepest portion of the source region, a second boundary between the source region and the channel region having a second doping gradient that changes more gradually than the first doping gradient; and
    a floating gate above the well and covering the channel region, at least a portion of the drain region, and the capacitive region, the capacitive region and the floating gate are capacitively coupled such that the floating gate has a voltage level that is at least 10% of a voltage level of the capacitive region, an entire bottom surface of the floating gate being substantially flat.

11. The non-volatile memory bitcell of claim 10, wherein an oxide region surrounds the drain region on two sides and is bordered by the source region, the capacitive region, and the channel region.

12. The non-volatile memory bitcell of claim 10, wherein the halo region comprises a second dopant selectively implanted by a low voltage lightly doped drain mask.

13. The non-volatile memory bitcell of claim 10, wherein the floating gate and the capacitive region have capacitive coupling such that a voltage level of the floating gate is at least 30% of a voltage level of the capacitive region when the floating gate is an off state.

14. The non-volatile memory bitcell of claim 10, comprising a first boundary between the drain region and the halo region having a first doping gradient, and a second boundary between the source region and the channel region having a second doping gradient that changes more gradually than the first doping gradient.

15. A non-volatile memory bitcell comprising:
a source region of a second conductivity type in a well of a first conductivity type;
a drain region of the second conductivity type in the well, the drain region implanted with a halo region of the first conductivity type, a first boundary between the drain region and the halo region having a first doping gradient;
a capacitive region formed in the source region and comprising a dopant of the second conductivity type, a second boundary between the source region and the channel region having a second doping gradient that changes more gradually than the first doping gradient; and
a floating gate above the well and covering at least part of the drain region and at least part of the source region the capacitive region creating a gate-source capacitance between the floating gate and the source region that is larger than a gate-drain capacitance between the floating gate and the drain region, an entire bottom surface of the floating gate being substantially flat.

16. The non-volatile memory bitcell of claim 10, wherein the capacitive region is configured to increase a gate-source capacitance between the floating gate and the source region relative to a gate-drain capacitance between the floating gate and the drain region.

17. The non-volatile memory bitcell of claim 15, wherein the floating gate and the capacitive region have capacitive coupling such that the floating gate has a voltage level that is at least 30% of a voltage level of the capacitive region when the floating gate is an off state.

18. A bitcell design for use with a complementary metal-oxide-semiconductor (CMOS) manufacturing process, the bitcell design specifying components of a bitcell comprising:
a source region of a second conductivity type in a well of a first conductivity type;
a drain region of the second conductivity type in the well, the drain region implanted with a halo region of the first conductivity type, a first boundary between the drain region and the halo region having a first doping gradient;
a channel region in the well between the drain region and the source region;
a capacitive region formed in the source region and comprising a dopant of the second conductivity type, a second boundary between the source region and the channel region having a second doping gradient that changes more gradually than the first doping gradient; and
a floating gate above the well and covering the channel region, at least a portion of the drain region and the capacitive region, a gate-source capacitance between the floating gate and the source region increased relative to a gate-drain capacitance between the floating gate and the drain region by the capacitive region, an entire bottom surface of the floating gate being substantially flat.

* * * * *